(12) United States Patent
Simin et al.

(10) Patent No.: US 9,894,723 B2
(45) Date of Patent: Feb. 13, 2018

(54) SOLID-STATE LIGHTING STRUCTURE WITH INTEGRATED CONTROL

(71) Applicant: Sensor Electronic Technology, Inc., Columbia, SC (US)

(72) Inventors: Grigory Simin, Columbia, SC (US); Michael Shur, Latham, NY (US); Alexander Dobrinsky, Loudonville, NY (US); Maxim S. Shatalov, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/387,586

(22) Filed: Dec. 21, 2016

(65) Prior Publication Data

US 2017/0196061 A1 Jul. 6, 2017

Related U.S. Application Data

(60) Provisional application No. 62/273,542, filed on Dec. 31, 2015.

(51) Int. Cl.
*H05B 33/08* (2006.01)
*H01L 27/15* (2006.01)
*H05B 37/02* (2006.01)

(52) U.S. Cl.
CPC ......... *H05B 33/0842* (2013.01); *H01L 27/15* (2013.01); *H05B 33/0809* (2013.01); *H05B 37/0227* (2013.01)

(58) Field of Classification Search
CPC .... H05B 33/02; H05B 33/08; H05B 33/0803; H05B 33/0806; H05B 33/0809; H05B 33/0833; H05B 33/0842
See application file for complete search history.

(56) References Cited

U.S. PATENT DOCUMENTS

| | | | |
|---|---|---|---|
| 4,837,526 A | 6/1989 | Suzuki et al. | |
| 7,154,149 B2 | 12/2006 | Wu et al. | |
| 2008/0048567 A1* | 2/2008 | Steele | H04N 1/40056 315/151 |

(Continued)

OTHER PUBLICATIONS

Meyaard, D., et al., "Temperature dependent efficiency droop in GaInN light-emitting diodes with different current densities," Applied Physics Letters, 2012, 3 pages.

(Continued)

*Primary Examiner* — Jason M Crawford
(74) *Attorney, Agent, or Firm* — LaBatt, LLC

(57) ABSTRACT

A solid-state light source (SSLS) structure with integrated control. In one embodiment, a SSLS control circuit can be integrated with a SSLS structure formed from a multiple of SSLSs. The SSLS control circuit controls the total operating current of the SSLS structure to within a predetermined total operating current limit by selectively limiting the current in individual SSLSs or in groups of SSLSs as each are turned on according to a sequential order. The SSLS control circuit limits the current in each of the individual SSLSs or groups of SSLSs as function of the saturation current of the SSLSs. In one embodiment, the individual SSLSs or groups of SSLSs has a turn on voltage corresponding to a voltage causing a preceding SSLS or group of SSLSs in the sequential order to saturate current.

20 Claims, 10 Drawing Sheets

(56) References Cited

U.S. PATENT DOCUMENTS

| | | | |
|---|---|---|---|
| 2012/0153844 A1* | 6/2012 | Chobot | H05B 33/083 |
| | | | 315/185 R |
| 2012/0194077 A1 | 8/2012 | Wei et al. | |
| 2013/0033105 A1* | 2/2013 | Yang | G09G 3/32 |
| | | | 307/31 |
| 2013/0069536 A1* | 3/2013 | Ni | H05B 33/0809 |
| | | | 315/122 |
| 2013/0169159 A1* | 7/2013 | Lys | H05B 33/083 |
| | | | 315/122 |
| 2014/0232288 A1* | 8/2014 | Brandes | H05B 33/0803 |
| | | | 315/250 |
| 2017/0077085 A1 | 3/2017 | Simin et al. | |
| 2017/0079102 A1 | 3/2017 | Simin et al. | |

OTHER PUBLICATIONS

Sze, et al., "Physics of Semiconductor Devices," Description and Table of Contents, Accessed on Sep. 8, 2016, 5 pages, ISBN-13: 978-0471143239.

\* cited by examiner

FIG. 2
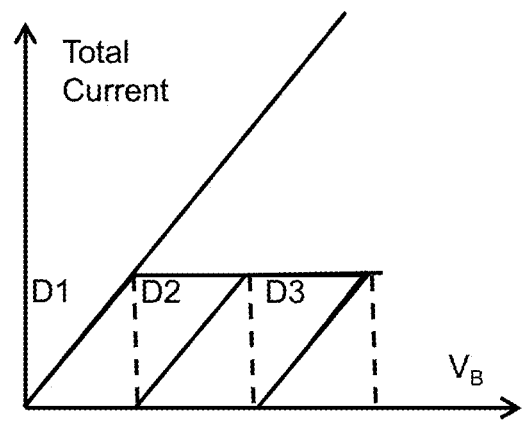
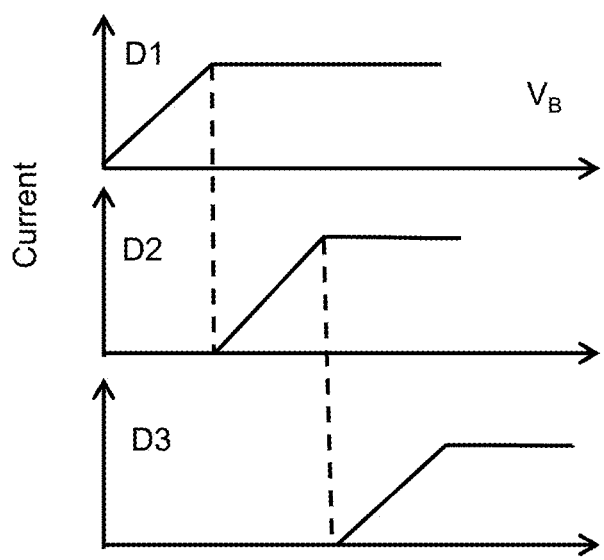

SOLID-STATE LIGHTING STRUCTURE WITH INTEGRATED CONTROL

REFERENCE TO RELATED APPLICATIONS

The present patent application claims the benefit of U.S. Provisional Application No. 62/273,542, which was filed on 31 Dec. 2015, and which is hereby incorporated by reference.

TECHNICAL FIELD

The present invention relates generally to solid-state lighting, and more particularly, to solid-state lighting source (SSLS) structures, such as light emitting diodes (LEDs) and lasers, with integrated control to attain a total operating current that is within a predetermined total operating current limit specified for obtaining a desired amount of optical power.

BACKGROUND ART

A great deal of interest has been focused on SSLSs, such as LEDs and lasers, and in particular, those that emit light in the blue and deep ultraviolet wavelengths. These devices may be capable of being incorporated into various applications, including solid-state lighting, biochemical disinfection and detection, high-density data storage, and the like.

Modern SSLSs, such as LEDs, typically include three major components: an electron supply layer (e.g., an n-type semiconductor layer), a hole supply layer (e.g., a p-type semiconductor layer), and a light generating structure formed between the electron supply layer and the hole supply layer. Generally, all types of SSLSs have an optimal range of operating currents within which they exhibit the highest efficiency and reliability. At low current densities, the efficiency of the SSLSs decreases due to an increased role of parasitic non-radiative recombination processes. When the current density is too high, the SSLSs exhibit efficiency droop caused by numerous processes such as temperature increases, electron leakage, poor hole injection, etc. For example, nitride-based SSLSs typically operate at high current density levels, and as a result, generally have a relatively high defect concentration. Maintaining the operating current within an optimal range is even more important for this device type. A typical range of current densities where nitride-based LEDs exhibit the highest efficiency at room temperature is generally within 50 A/cm$^2$ to 300 A/cm$^2$.

Attempts to control the operating current of SSLSs at a range that is considered between low current density levels and high density levels have relied on electronic circuits connected to the SSLSs to control the operating current. These electronic circuits are typically fabricated separately from the SSLSs and are connected to them using wiring or like techniques. These solutions may adversely affect the performance of the SSLSs by generating parasitic circuit parameters that increase switching time and lead to unwanted transients. In addition, the electronic circuits can have hybrid type connections to the SSLSs that can adversely affect system reliability and temperature stability.

SUMMARY OF THE INVENTION

This Summary of the Invention introduces a selection of certain concepts in a brief form that are further described below in the Detailed Description Of The Invention. It is not intended to exclusively identify key features or essential features of the claimed subject matter set forth in the Claims, nor is it intended as an aid in determining the scope of the claimed subject matter.

Aspects of the present invention are directed to controlling the total operating current of a SSLS structure formed from multiple SSLSs to within a predetermined total operating current limit specified for obtaining a desired amount of optical power. The capability of controlling the total operating current of the SSLS structure to within a predetermined total current limit enables the total operating current of the structure to be set to a current level that precludes low-current densities and high current densities and their accompanying problems.

Embodiments of the present invention utilize a SSLS control circuit integrated with the SSLS structure to control the total operating current of the structure within the predetermined total operating current limit. In one embodiment, the SSLS control circuit can include current limiters and electronic switches with different turn-on voltages connected to different SSLSs in the SSLS structure. For example, the SSLS control circuit can include a plurality of field-effect transistors, with each field-effect transistor connected in series to one of the SSLSs, and a plurality of field-effect transistor activation components (e.g., diodes) configured to activate the plurality of field-effect transistors.

In one embodiment, the SSLS control circuit can turn on individual SSLSs and groups of SSLS in a sequential order until all SSLSs in the SSLS structure are turned on. For example, the saturation current associated with the SSLSs can be used as a basis to turn on the individual SSLSs or group of SSLSs. In one embodiment, after the SSLS control circuit has turned on a first individual SSLS or group of SSLSs, then each subsequent individual SSLS or group of SSLSs in the sequential order can be turned on in response to the first individual SSLS or first group of SSLSs attaining the saturation current. That is, the subsequent individual SSLS or group of SSLSs that are turned on can have a turn on voltage corresponding to a voltage causing the first individual SSLS or first group of SSLSs to be turned on to saturation current. The SSLS control circuit can then turn on each subsequent individual SSLS or group of SSLSs in the sequential order as function of a preceding individual SSLS or group of SSLSs in the order reaching its saturation current. In this manner, the field-effect transistors and the corresponding field-effect transistor activation components of the SSLS control circuit enable current limiting for an SSLS or a group of connected SSLSs that maintains the operating current within the required limit, and sequential turning on of the next SSLSs or group of SSLSs through their respective field-effect transistors and field-effect transistor activation components, and so forth, until all the elements forming the SSLS structure are turned on.

In other embodiments, various components can be added to the SSLS structure and the SSLS control circuit configuration to complement the control of the total operating current of the structure. For example, in one embodiment, a voltage supply can be connected to the SSLS structure and the SSLS control circuit. In another embodiment, a current supply can be connected to the SSLS structure and the SSLS control circuit. In yet another embodiment, a control voltage supply can be connected to a gate of each of the field-effect transistors that form the SSLS control circuit.

In one embodiment, the SSLS control circuit can include a plurality of integrated SSLS control circuits. In this manner, each integrated SSLS control circuit can be integrated with one of the SSLSs in the SSLS structure, and be configured to limit current within its corresponding SSLS. For example, all of the integrated SSLS control circuits and their corresponding SSLSs can be implemented in a series or a parallel SSLS structured-array. With this configuration, the total optical power of the SSLS structured-array can be increased.

In another embodiment, the plurality of integrated SSLS control circuits can be connected to a DC voltage to an AC voltage converter. This enables an AC voltage supply or current supply to be coupled to the plurality of integrated SSLS control circuits and the SSLS structured array.

In still another embodiment, the plurality of integrated SSLS control circuits and SSLS structured-array can be arranged to form a first group and a second group of devices. The first group can include integrated SSLS control circuits with its corresponding SSLSs having their anodes connected to a positive terminal of an AC voltage supply, and the second group can include integrated SSLS control circuits with its corresponding SSLSs having their anode connected to a negative terminal of the AC voltage supply. This configuration enables a connection to an AC source without having to use any additional electronic converters such as a DC voltage to an AC voltage converter. In this manner, there is an anti-parallel or flipped connection between the first group and the second group. For example, the first group could turn on when the polarity of the AC source is positive, while the second group would be kept turned off. Similarly, when the AC source polarity is negative, the second group could turn on, while the first group would be turned off.

A first aspect of the invention provides device, comprising: a solid-state light source (SSLS) structure including an array of SSLSs; and a SSLS control circuit integrated with the SSLS structure to control a total operating current of the SSLS structure within a predetermined total operating current limit, wherein the SSLS control circuit is configured to selectively limit current in individual SSLSs and in groups of SSLSs to maintain the total operating current of the SSLS structure within the predetermined total operating current limit, the SSLS control circuit maintaining the total operating current of the SSLS structure within the predetermined total operating current limit as a function of a saturation current associated with the SSLSs.

A second aspect of the invention provides a device, comprising: a solid-state light source (SSLS) structure including a plurality of SSLSs; a SSLS control circuit integrated with the SSLS structure to control a total operating current of the SSLS structure within a predetermined total operating current limit specified for attaining a desired amount of optical power, wherein the SSLS control circuit comprises a plurality of field-effect transistors, each field-effect transistor connected in series to one of the SSLSs in the SSLS structure, and a plurality of field-effect transistor activation components configured to activate the plurality of field-effect transistors, wherein most of the field-effect transistors comprise a corresponding field-effect transistor activation component, wherein the SSLS control circuit is configured to turn on individual SSLSs and groups of SSLS in a sequential order as a function of a saturation current associated with the SSLSs.

A third aspect of the invention provides a device, comprising: a solid-state light source (SSLS) structure including a plurality of SSLSs; a SSLS control circuit to maintain a total operating current of the SSLS structure within a predetermined total operating current limit, wherein the SSLS control circuit comprises a plurality of SSLS control circuits, each SSLS control circuit integrated with one of the SSLSs in the array of the SSLS structure to limit current within its corresponding SSLS as a function of a saturation current associated with the SSLSs, all of the SSLS control circuits and corresponding SSLSs forming an array of SSLSs and SSLS control circuits; and one of a current source and a voltage source coupled to the array of SSLSs and SSLS control circuits.

A fourth aspect of the invention provides a method comprising: fabricating a solid state light source (SSLS) with integrated SSLS control, wherein the SSLS with integrated SSLS control comprises: a SSLS structure including an array of SSLSs; and a SSLS control circuit integrated with the SSLS structure to control a total operating current of the SSLS structure within a predetermined total operating current limit, wherein the SSLS control circuit is configured to selectively limit current in individual SSLSs and in groups of SSLSs to maintain the total operating current of the SSLS structure within the predetermined total operating current limit, the SSLS control circuit maintaining the total operating current of the SSLS structure within the predetermined total operating current limit as a function of a saturation current associated with the SSLSs.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the present invention taken in conjunction with the accompanying drawings that depict various aspects of the invention.

FIG. 2 shows current-voltage dependencies of individual SSLSs selected from the multi-element SSLS structure of FIG. 1, as well the current voltage dependency for the whole SSLS structure according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
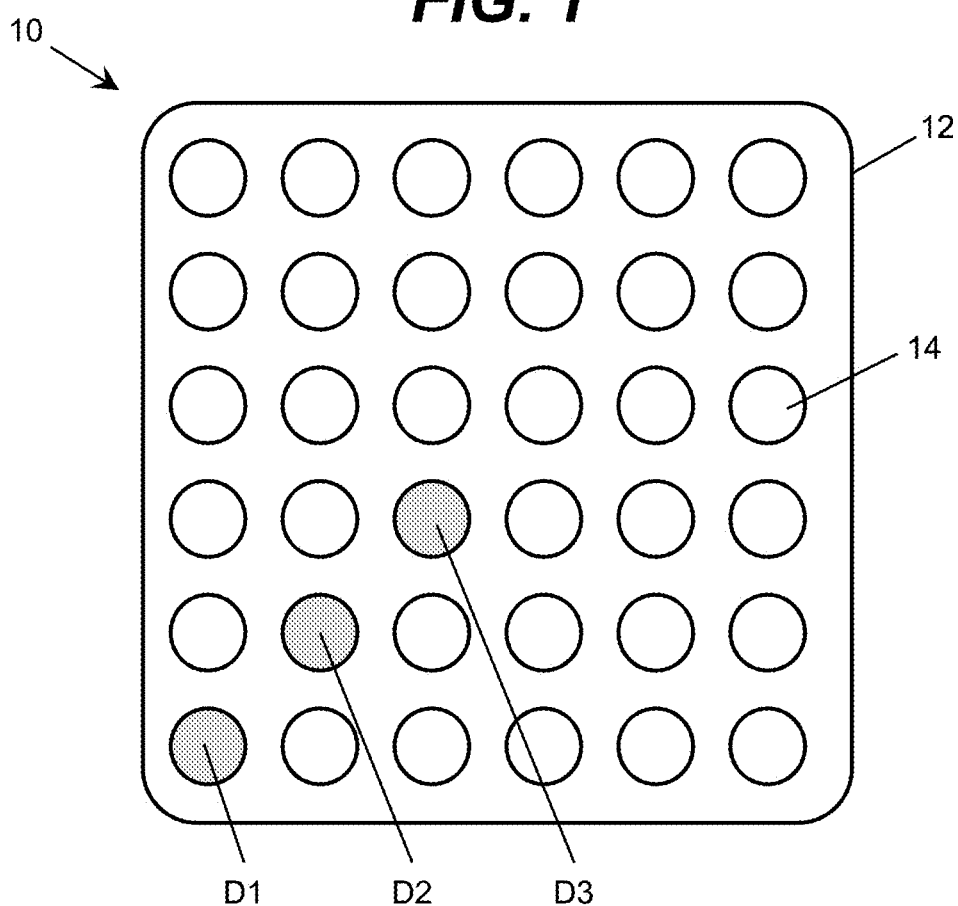
FIG. 1 shows a schematic diagram of a multi-element SSLS structure according to an embodiment.

The various embodiments are directed to controlling the total operating current of a SSLS structure formed from multiple SSLSs to within a predetermined total operating current limit using the saturation currents of the SSLSs as a basis to turn on the SSLSs. In one embodiment, a SSLS control circuit can be integrated with the SSLS structure to maintain the total operating current of the structure within the predetermined total operating current limit. The SSLS control circuit can include a plurality of field-effect transistors, each connected in series to one of the SSLSs, and a field-effect transistor activation component (e.g., diodes) associated with each field-effect transistor that is configured to activate the field-effect transistor, and thus, the SSLS. By using the saturation current of the SSLSs as a basis to turn on the SSLSs, the SSLS control circuit can be used to turn on individual SSLSs and groups of SSLS in a sequential order until all SSLSs in the SSLS structure are turned on. For example, after a first individual SSLS or group of SSLSs has been turned on, the SSLS control circuit can use the point at which these SSLS(s) begin to saturate the current to turn on the next individual SSLS or group of SSLSs in the sequential order. The SSLS control circuit can then turn on each subsequent individual SSLS or group of SSLSs in the sequential order as function of a preceding individual SSLS or group of SSLSs in the sequential order reaching its saturation current.

In effect, the current is limited for each SSLS or group of SSLSs that is turned on while progressing through the sequential order, thereby enabling the SSLS control circuit to maintain the total operating current of the SSLS structure to within the predetermined total operating current limit. Having the capability to control the total operating current of the SSLS structure to within a predetermined total current limit makes it easier to implement the SSLS structure in a multitude of applications that have varying optical power requirements, without incurring any of the aforementioned problems associated with low current densities and high current densities that can arise when such fine control of the SSLS current is not available.

As used herein, a SSLS is any device, such as a diode that, under normal operating conditions, operates in a forward-bias mode. The SSLS can include a multitude of SSLSs such as for example, a p-n junction SSLS, a multiple-quantum well SSLS and a heterojunction SSLS. In one embodiment, the SSLS can include any type of semiconductor LED such as conventional and super luminescent LEDs, ultraviolet LEDs, light emitting solid state lasers, laser diodes, ultraviolet laser diodes, and/or the like. These examples of SSLSs can be configured to emit electromagnetic radiation from a light generating structure such as an active region upon application of a bias. The electromagnetic radiation emitted by these SSLSs can comprise a peak wavelength within any range of wavelengths, including visible light, ultraviolet radiation, deep ultraviolet radiation, infrared light, and/or the like. For example, these SSLSs can emit radiation having a dominant wavelength within the ultraviolet range of wavelengths. As an illustration, the dominant wavelength can be within a range of wavelengths of approximately 210 nanometers (nm) to approximately 350 nm.

Any of the various layers that form the SSLSs can be considered to be transparent to radiation of a particular wavelength when the layer allows an amount of the radiation radiated at a normal incidence to an interface of the layer to pass there through. For example, a layer can be configured to be transparent to a range of radiation wavelengths corresponding to a peak emission wavelength for light, such as ultraviolet light or deep ultraviolet light, emitted by the SSLS (e.g., peak emission wavelength +/− five nanometers). As used herein, a layer is transparent to radiation if it allows more than approximately five percent of the radiation to pass there through, while a layer can also be considered to be transparent to radiation if it allows more than approximately ten percent of the radiation to pass there through. Defining a layer to be transparent to radiation in this manner is intended to cover layers that are considered transparent and semi-transparent.

A layer of the SSLS can be considered to be reflective when the layer reflects at least a portion of the relevant electromagnetic radiation (e.g., light having wavelengths close to the peak emission of the light generating structure). As used herein, a layer is reflective to radiation if it can reflect at least approximately five percent of the radiation, while a layer can also be considered to be reflective if it reflects at least thirty percent for radiation of the particular wavelength radiated normally to the surface of the layer. A layer can be considered highly reflective to radiation if it reflects at least seventy percent for radiation of the particular wavelength radiated normally to the surface of the layer.

The description that follows may use other terminology herein for the purpose of describing particular embodiments only and is not intended to be limiting of the disclosure. For example, unless otherwise noted, the term "set" means one or more (i.e., at least one) and the phrase "any solution" means any now known or later developed solution. The singular forms "a," "an," and "the" are intended to include the plural forms as well, unless the context clearly indicates otherwise. It will be further understood that the terms "comprises", "comprising", "includes", "including", "has", "have", and "having" when used in this specification, specify the presence of stated features, integers, steps, operations, elements, and/or components, but do not preclude the presence or addition of one or more other features, integers, steps, operations, elements, components, and/or groups thereof.

Turning to the drawings, FIG. 1 shows a schematic diagram of a multi-element SSLS structure 10 according to an embodiment. As shown in FIG. 1, the multi-element SSLS structure 10 can include an array 12 of SSLSs 14 arranged in rows and columns. In one embodiment, the array 12 of SSLSs 14 can take the form of a lamp, while the SSLSs 14 can include a semiconductor light-emitting diode (LED). For illustrative purposes in explaining the various embodiments described herein, three of the LEDs in FIG. 1 are referenced as D1, D2, and D3. It is understood that the other LEDs 14 depicted in the array 12 of SSLSs 14 could be labeled with similar non-overlapping reference elements.

The array 12 of SSLSs 14 will require a certain amount of current to produce a designated amount of optical power for its intended application. It is understood that any type of SSLS used in a device will have an optimal range of operating currents within which the device exhibits the highest efficiency and reliability. As noted above, at low current densities, the efficiency of the SSLSs decreases due to an increased role of parasitic non-radiative recombination processes. When the current density is too high, the SSLSs exhibit efficiency droop caused by numerous processes such as temperature increases, electron leakage, poor hole injection, etc. For example, nitride-based SSLSs typically operate at high current density levels, and as a result, generally have a relatively high defect concentration. Maintaining the operating current within an optimal range is even more important for this device type. A typical range of current densities where nitride-based LEDs exhibit the highest efficiency at room temperature is generally within 50 A/cm$^2$ to 300 A/cm$^2$.

The multi-element SSLS structure 10 of FIG. 1 overcomes the above-noted problems by utilizing a SSLS control circuit, which is described herein in more detail, to control the total operating current of the SSLS structure 10 using the saturation currents of the SSLSs 14 as a basis to turn on the SSLSs. In particular, the SSLS control circuit can turn on individual SSLSs 14 or groups of SSLSs in the array 12 in a sequential order as a function of the saturation current of the SSLSs. More specifically, once the saturation current of an individual SSLS 14 or group of SSLSs in the array 12 has been reached, the SSLS control circuit can be configured to turn on the next SSLS 14 or group of SSLSs in the sequential order. After that particular SSLS 14 or group of SSLSs in the array has reached its saturation, then the next SSLS or group of SSLSs in the order is turned on. This process continues until all of the SSLSs 14 in the array 12 are turned on. In this operation, the SSLS control circuit essentially limits the current of the individual SSLSs 14 or groups of SSLSs to keep them within a predetermined total operating current limit while providing a high amount of total power. This ensures that at the same time the current never goes below a level that causes a droop or reliability degradation.

FIG. 2 shows examples of current-voltage dependency plots 16 for the multi-element SSLS structure 10 of FIG. 1. In particular, FIG. 2 shows current-voltage dependency plots 16 for the LEDS D1, D2, D3 highlighted in FIG. 1, as well a current-voltage dependency plot for the whole SSLS structure 10. As shown in the top plot of FIG. 2, the LED D1 is the first SSLS of the LEDs to be turned on. At some point, the current passing through D1 begins to saturate, which is shown in FIG. 2 by the leveling of the plot for this LED. As the current through D1 saturates, the next SSLS, D2 turns on. The third LED D3 will turn on at the input voltage or current value where the current of D2 saturates. This is shown in the top plot where the input voltage or current value of D2 begins to level off as the third SSLS or a group of SSLSs turns on. This process would continue in a similar manner sequentially turning on the other SSLSs 14 in the array 12 according to a predetermined order until all of the LEDs have been turned on.

As shown in the other plots of FIG. 2, which specifically show the current-voltage dependencies of D1, D2, and D3, there is a turn-on voltage offset associated with these LEDs that corresponds to the point at which its immediately, preceding SSLS in the sequential order begins to saturate. In this manner, the total current of the SSLS structure can increase without causing the current to exceed the limit flowing through individual SSLSs. It is understood, that although the turning on of the SSLS in FIG. 2 is described with respect to an individual SSLS, it is also applicable to instances in which groups of SSLSs are to be turned on.

Figure 3:
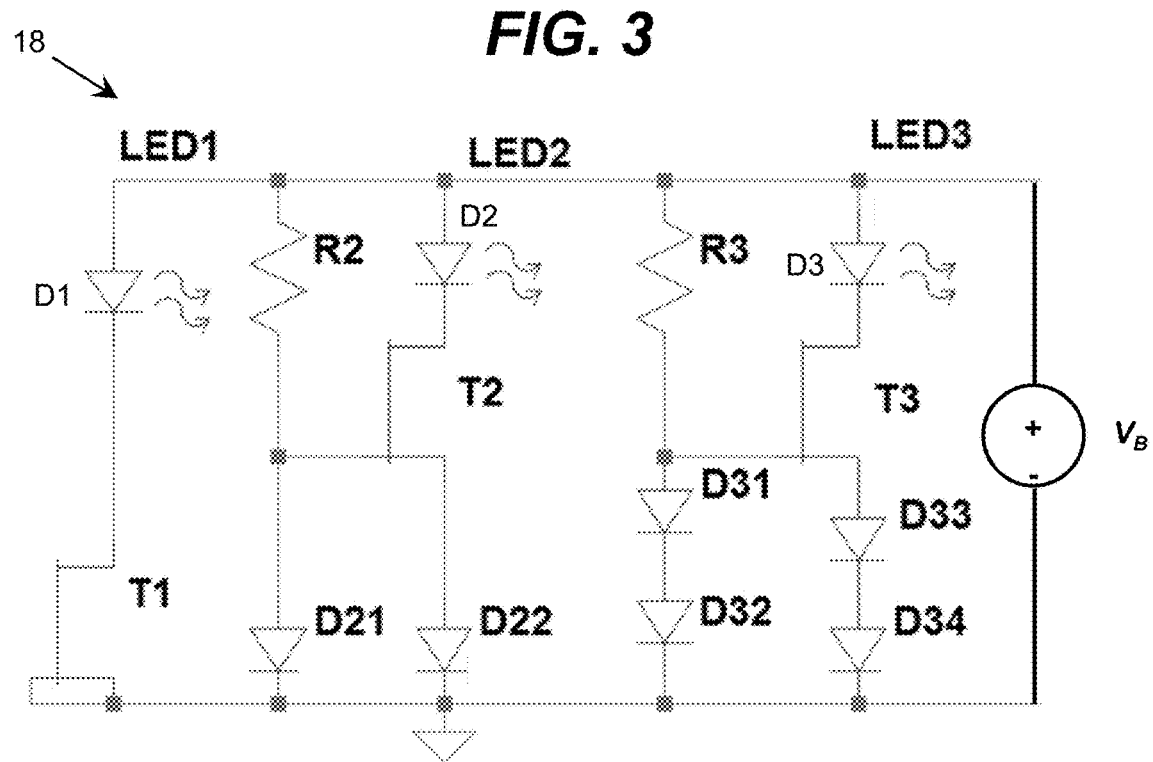
FIG. 3 shows a schematic diagram of a SSLS control circuit for controlling SSLS current in selected SSLSs of a multi-element SSLS structure according to an embodiment.

FIG. 3 shows a schematic diagram of a SSLS control circuit 18 for controlling SSLS current in SSLSs of a multi-element SSLS structure according to an embodiment. For clarity in describing this embodiment, the SSLS control circuit 18 is described with respect to the SSLS structure 10 depicted in FIG. 1 where LEDs D1, D2, and D3 are referenced and turned-on in the manner described with respect to FIG. 2. The SSLS control circuit of the various embodiments described herein can be integrated with the SSLS structure, and can include a plurality of field-effect transistors (FETs), wherein each field-effect transistor (FET) is connected in series to one of the SSLSs in the SSLS structure. In addition, the SSLS control circuit can further include a plurality of diodes, such that most of the FETs have at least one diode connected to their respective gates and sources. In addition, these diodes associated with each transistor can be in parallel with the diodes associated with the other transistors in the SSLS control circuit. Each of the diodes that are connected to the gates and sources of the FETs can have a turn on voltage that is adjusted to correlate with the saturation current of their corresponding SSLS of which they control. The turn on voltages of each of these diodes can be offset a predetermined amount from the turn on voltages of each diode associated with an immediately adjacent field-effect transistor.

In the embodiment illustrated in FIG. 3, the SSLS control circuit includes FET T1 connected to LED D1 which is representative of one SSLS in a SSLS structure. In this embodiment, the gate and source of FET T1 can be connected to ground, while its drain can be connected to the cathode of LED D1. The anode of the LED D1 can be connected to a node coupling a voltage supply $V_B$. In this configuration, the anode of the LED D1 can be connected to the positive terminal of the voltage supply $V_B$, while the gate and source of FET T1 can be connected to the negative terminal of the voltage supply $V_B$.

The SSLS control circuit of FIG. 3 further includes a component for controlling another SSLS in the SSLS structure, LED D2. In this embodiment, FET T2 can be connected to the LED D2, such that the anode of D2 is connected to the node coupling with the positive terminal voltage supply $V_B$, and the cathode of D2 is connected to the drain of FET T2. The gate and source of FET T2 can be connected to the anodes of diodes D21 and D22, which are in parallel with each other. Also, as shown in FIG. 3, resistor R2 can be coupled in series with the diode D21 through its anode, and coupled to the anode of the diode D22 through the gate and source of FET T2.

In this configuration, the cathodes of diodes D21 and D22 can be connected to ground and the negative terminal of the voltage supply $V_B$. The diodes D21 and D22 that are connected to the gate and source of FET T2 enable LED D2 to have a turn on voltage that is close to the voltage causing current saturation through LED D1. It is understood that other approaches can be used to attain this required turn on voltage such as, for example, by using diode barrier height engineering, connecting multiple diodes in series with SSLS, using available voltage-shift circuits, and/or using other known methods.

The SSLS control component of LED D3 is similar. For instance, FET T3 can be connected to the LED D3, such that the anode of D3 is connected to the node coupling with the positive terminal voltage supply $V_B$, and the cathode of D3 is connected to the drain of FET T3. The gate and source of FET T3 can be connected to the anodes of diodes D31 and D33, which are in parallel with each other, and connected in series to diodes D32 and D34, respectively, which are coupled to ground and the negative terminal of the voltage supply $V_B$. The diodes D31, D33, D32 and D34 are also coupled with a resistor R3. It is understood that the SSLS control circuit(s) for the next SSLS(s) in the array could have a component similar to LED D3, except that each subsequent SSLS control circuit would have an increasing number of diodes, e.g., a set of six, eight, ten, etc., diodes coupled to the gate and source of the corresponding FET in order to maintain the turn on voltage that is offset from the saturation of the immediately preceding SSLS that is turned on. To this extent, all subsequent SSLS control circuits could be similar except that there would be additional diodes to facilitate the offset turn on voltage.

It is understood that if the SSLSs in the SSLS structure were to turn on in groups, then each of the groups of SSLSs would have similar SSLS control circuitry components as other SSLSs in its group, while groups of immediately preceding and subsequent SSLSs would have different componentry in order to effectuate the aforementioned offset turn on voltage. For example, if LEDs D2 and D3 were part of the same group in the sequential order of turning on the SSLS structure shown in FIG. 3 (i.e., after turning on FET T1), then both LEDs D2 and D3 would have two diodes D21, D22 connected to the gates and sources of FET T2 and T3, respectively, each would be connected to a respective resistor R2.

In the example illustrated in FIG. 3, the diodes and FETS that are connected to each of the SSLS are configured to have different turn on voltages, corresponding to the voltages at which the current of the immediately preceding LED in the sequential order of turning on the SSLSs saturates. As noted above, the saturation current of each LED is controlled by the saturation current of the FET connected to it. It is understood that the diodes and FETs connected to each of the LEDs that form the SSLSs in this example can be designed to have a turn on voltage that is offset from the electrical components of its preceding and succeeding SSLS in the sequential order. As an example, if the current of the LED1 is to be limited to 100 mA, then the FET T1 connected to LED1 can be designed to have a saturation current of 100 mA at zero gate bias. Considering a GaN-based high electron mobility transistor (HEMT) as an illustrative example of a FET that can be integrated with a LED, the above design requirement can lead to choosing a HEMT with a width that is typically around 100 μm. It is understood that a particular device width would depend on the epitaxial structure, material quality, gate type, etc. Further, it is understood that any known rules can be used to design the HEMT with the required saturation current.

Figure 4:
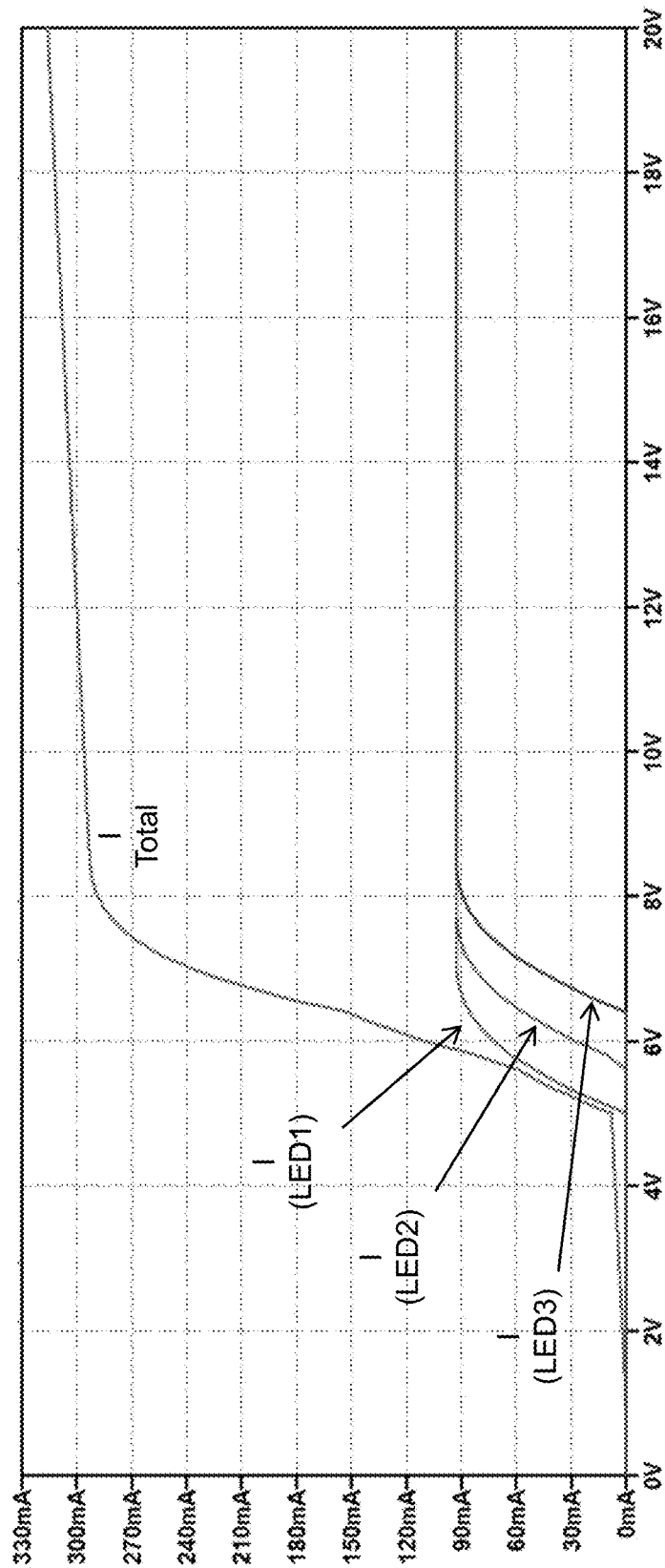
FIG. 4 shows an example of simulated current-voltage characteristics of the individual SSLSs depicted in FIG. 3, as well as simulated current-voltage characteristics of the whole multi-element SSLS structure according to an embodiment.

FIG. 4 shows an example of simulated current-voltage characteristics of the individual SSLSs depicted in FIG. 3, as well as simulated current-voltage characteristics of the whole multi-element SSLS structure according to an embodiment. For the simulations of FIG. 4, the characteristics of the LEDs, which form the SSLSs in the SSLS structure, and the FETs and diodes, which form the SSLS control circuit, have been chosen to correspond to typical characteristics of Group III-nitride based LEDs, HEMTs and Schottky diodes. The results of the simulations show that the total current of the SSLS structure (e.g., a lamp) increases quasi-linearly with the input voltage. As noted above, LED1 turns on first. Then LED2 turns on when the current in LED1 begins to saturate. Similarly, the LED3 turns on when the current in LED2 begins to saturate. The turning on and saturation of these LEDs are shown in the results of FIG. 4 by small kinks in the current curves for LED1, LED2, and LED3. These small kinks do not deteriorate the overall system performance because an important characteristic of a SSLS structure such as a lamp is linear power, which has a current dependence and not a current-voltage dependence. In this embodiment, the power-current dependence is given by that of an individual LED, and hence, it remains linear even in the presence of the kinks.

Figure 5:
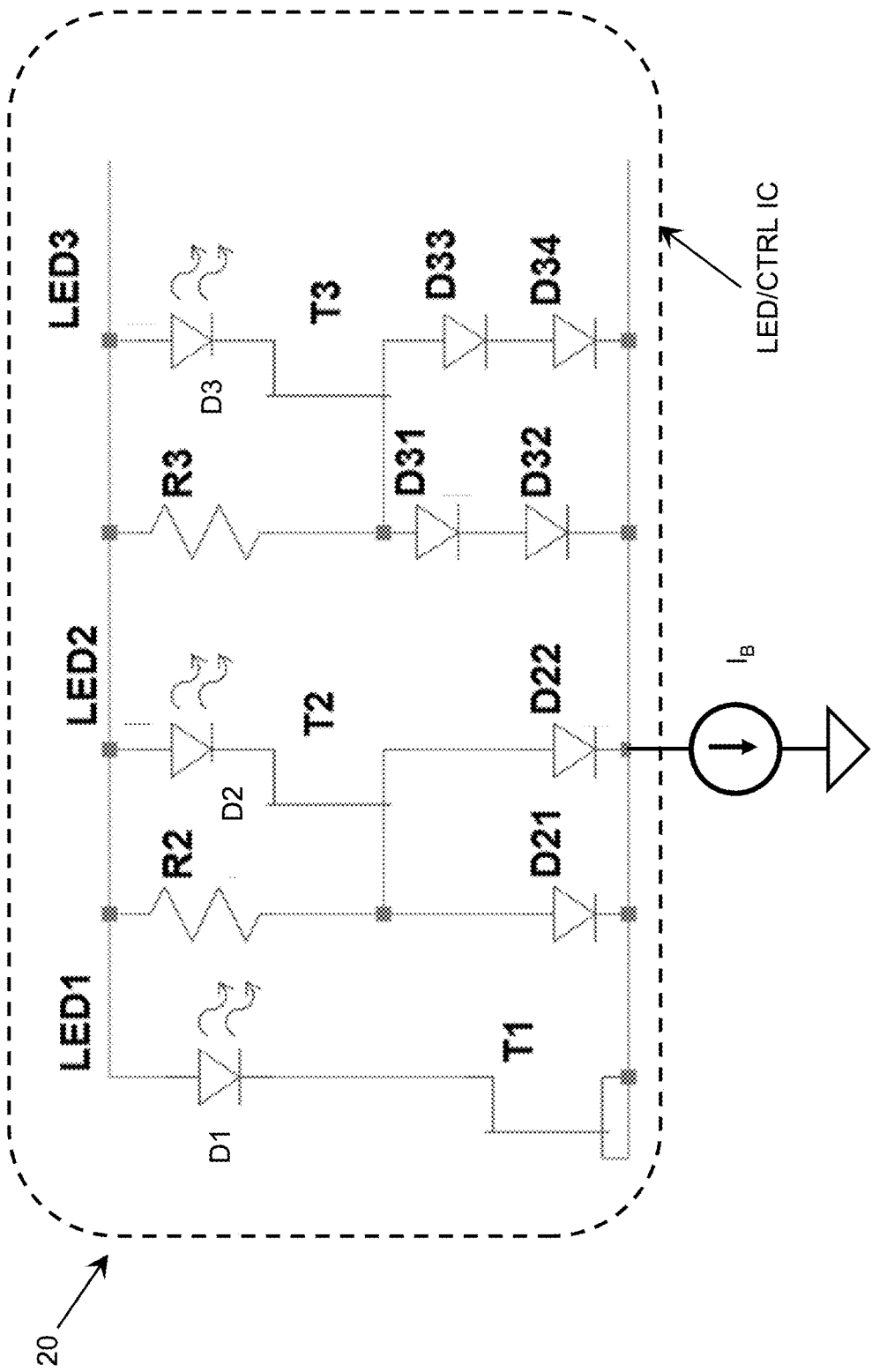
FIG. 5 shows a schematic diagram of the SSLS control circuit depicted in FIG. 3 with a current source connected thereto according to an embodiment.

FIG. 5 shows a schematic diagram of a SSLS control circuit 20 that is similar to the one depicted in FIG. 3, except in this embodiment, the voltage supply $V_B$ has been removed, and a current source $I_B$ has been added. As shown in FIG. 5, the current source $I_B$ can be placed between ground and the node that is coupled to the gate and source of FET T1 and the cathodes of diodes D21, D22, D32 and D34. In this embodiment, the total source current from the current source $I_B$ is distributed between existing branches according to the "on" or "off" state of the branches of the SSLS control circuit for LED1, LED2 and LED3. In particular, the circuit branches containing LED1, LED2, LED3, etc., form a current divider, in which a larger portion of the current flows into the branch with lower resistance. At low IB values, all of the source current flows through the branch for LED1 (D1-T1). Other branches (LED2, LED3, etc.) present a much higher resistance because the level offset diodes D21, D22, D31, D32, D33, D34, etc., are not biased above their turn-on voltage. As the source current $I_B$ increases, the current through transistor T1 saturates, the differential resistance of the branch for LED1 rapidly increases and the current starts flowing through the branch for LED2. Similar to the circuit of FIG. 3, each subsequent branch is designed so that it turns on at the same current that causes the saturation of the previous branch.

Figure 6:
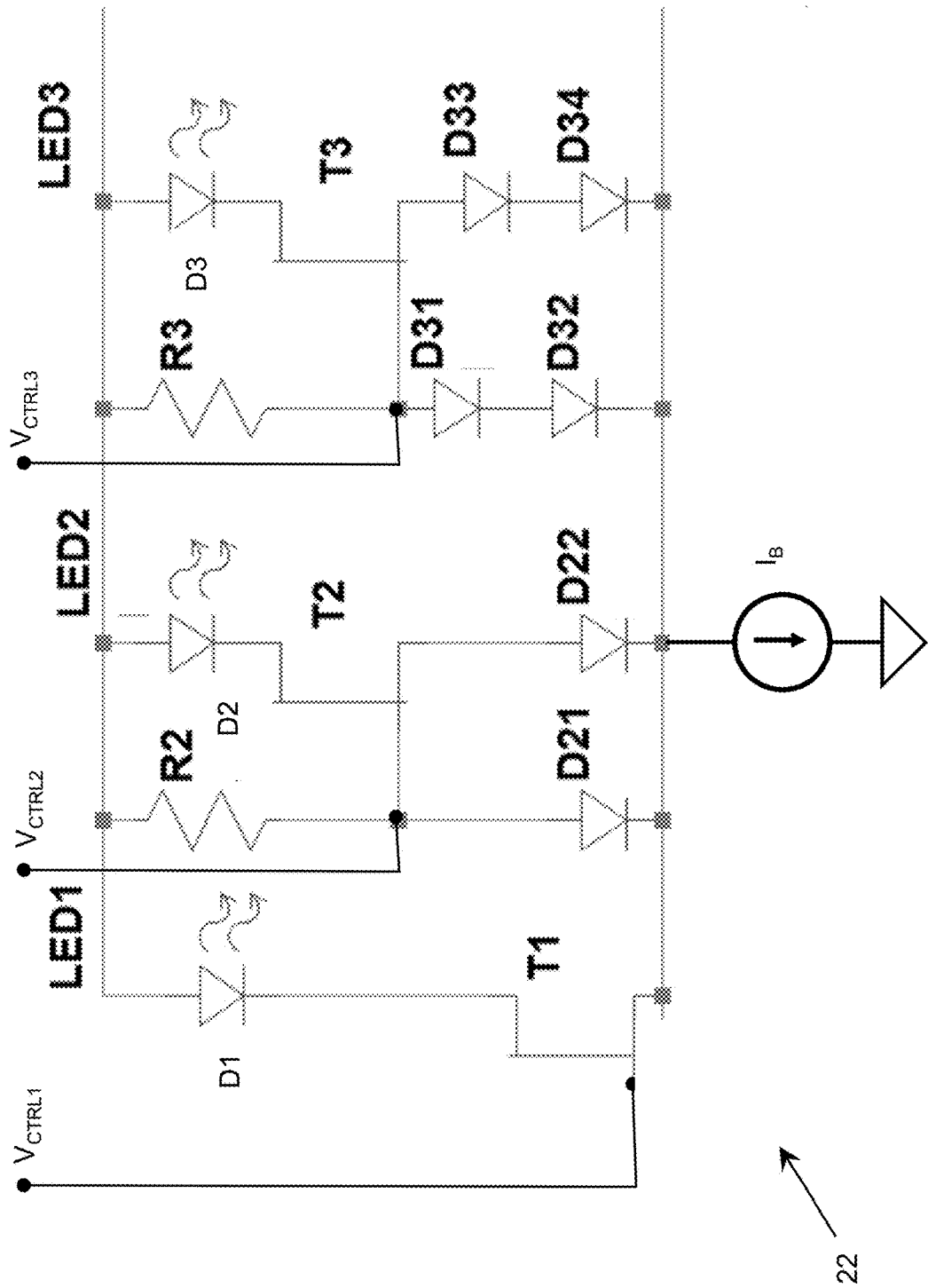
FIG. 6 shows a schematic diagram of the SSLS control circuit depicted in FIG. 5 with a control voltage supply connected to a gate of each field-effect transistor that forms the SSLS control circuit according to an embodiment.

FIG. 6 shows a schematic diagram of a SSLS control circuit 22 similar to the one depicted in FIG. 5, except in this embodiment, a control voltage supply $V_{CTRL}$ has been added to complement the current source $I_B$. As shown in FIG. 6, the control voltage supply $V_{CTRL}$ is connected to the FETs such that $V_{CTRL1}$ is connected to the gate of FET T1, $V_{CTRL2}$ is connected to the gate of FET T2, and $V_{CTRL3}$ is connected to the gate of FET T3. Having each of the control voltage supplies $V_{CTRL1}$, $V_{CTRL2}$, and $V_{CTRL3}$ connected to the gates of FET1, FET2, FET3, respectively, provides the capability of adjusting the saturation current and/or turn on voltages of each of the individual branches of FETs and diodes that form the components for the SSLS control circuit for the SSLSs (e.g. LEDs) with an additional voltage supply. In particular, applying control voltage $V_{CTRL2}$ to the diodes D21, D22 offsets their turn on voltage by the voltage $V_{CTRL2}$. This changes a level of the current at which the branch for LED2 turns on. It is understood that a similar tuning approach can be applied to the voltage source driven circuit shown in FIG. 3. In this manner, the performance of a SSLS structure, such as a lamp, can be improved by the voltage control supplies added to the gates of each of the FETs T1-T3.

Figure 7A:
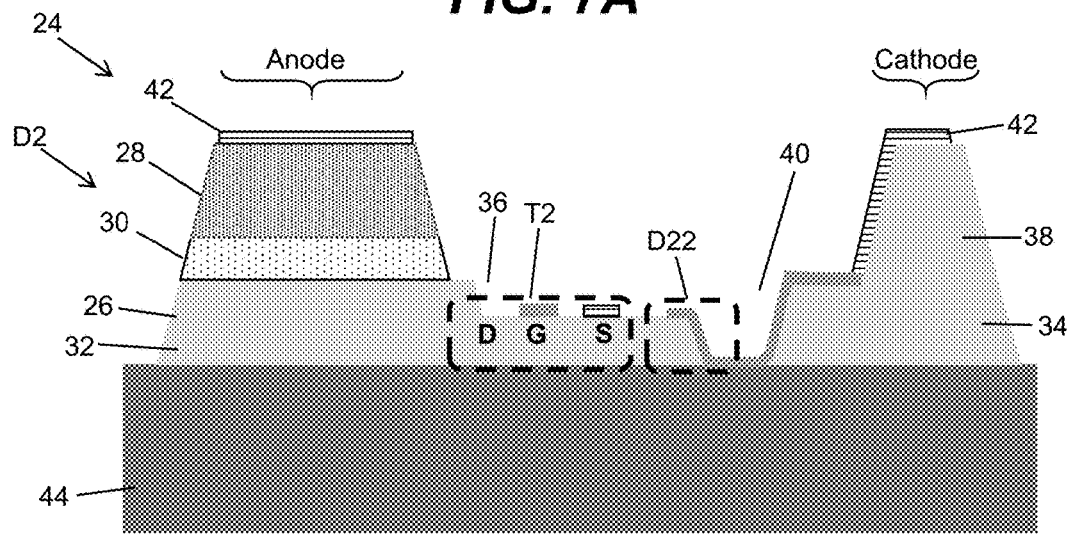
FIGS. 7A-7B show schematic layouts of a monolithically integrated SSLS and electronic control circuit according to an embodiment.
Figure 7B:
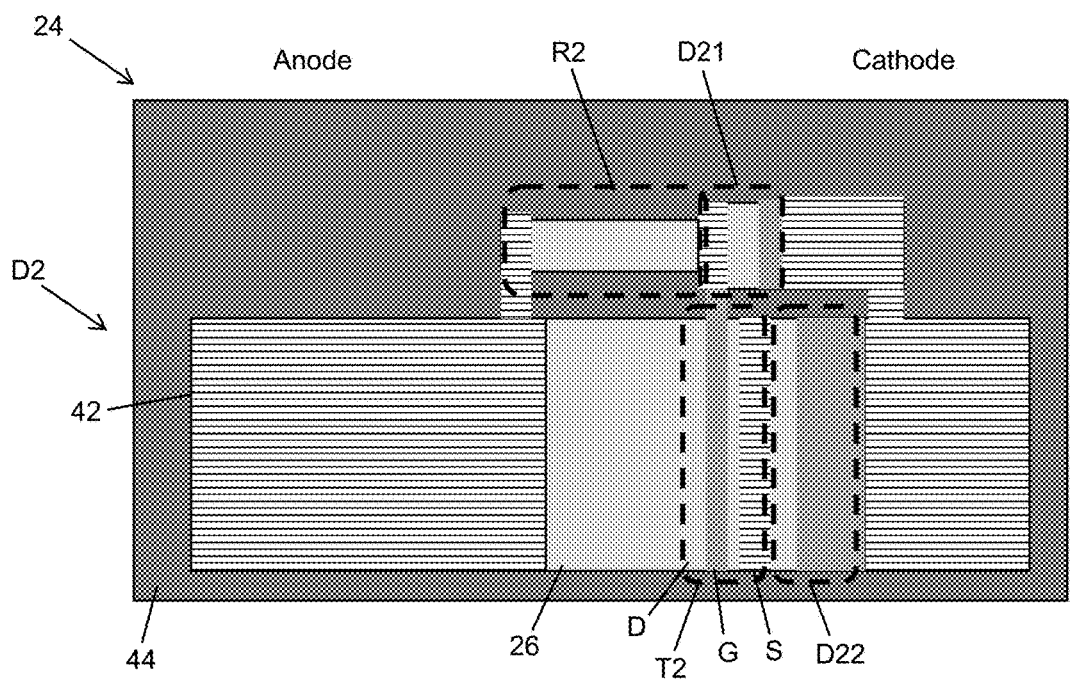

FIGS. 7A-7B show a schematic layout of a monolithically integrated SSLS and electronic control circuit 24 according to an embodiment. In particular, FIGS. 7A-7B show cross-sectional and top views of a portion of the monolithically integrated SSLS and electronic control circuit 24, respectively, as it corresponds to the branch of LED2 that includes D2, FET T2, R2, D21 and D22 as depicted in FIGS. 3 and 5-6. It is understood that the other corresponding branches of the SSLS structure would have similar layouts except that these layouts would have a number of resistors and diodes that corresponds with those used in each branch.

As shown in FIG. 7A, the SSLS LED D2 can include an n-type semiconductor layer 26 (e.g., an electron supply layer), a p-type semiconductor layer 28 (e.g., a hole supply layer) and a light generating structure 30 (e.g. a multi-quantum well) formed between the n-type semiconductor layer and the p-type semiconductor layer. The FET T2, can be monolithically connected in series with the SSLS LED D2. In one embodiment, the FET T2 12 can be integrated within the n-type semiconductor layer 26 to form an n-channel FET. As shown FIG. 7A, the FET T2 can include a gate electrode G, a source electrode S and a drain region D. The drain region D of the FET T2 is coupled to the n-type side of LED D2, while the source electrode S is coupled to the diode D22.

FIG. 7A shows that the n-type semiconductor layer 26 can include a first horizontally extending region 32, a second horizontally extending region 34, a recessed region 36 formed between the first horizontally extending region 32 and the second horizontally extending region 34, and an elevated region 38 extending upward from the second horizontally extending region 34. The FET T2 can be formed on a portion of a surface of the recessed region 36. The diode D22 can also be formed on a portion of a surface of the recessed region 36 as well as another recessed region 40 formed between the first horizontally extending region 32 and the second horizontally extending region 34 of the n-type semiconductor layer 26. As shown in FIG. 7A, the diode D22 can extend along the surface of the recessed region 34 of the n-type semiconductor layer 26 in the first horizontally extending region 32 and down against a sidewall forming the recessed region 40. The diode D22 continues along a bottom surface of the recessed region 40 and extends up against an opposing sidewall forming the recessed region 40. The diode D22 wraps around a surface of the second horizontally extending region 34 of the n-type semiconductor layer 26 and terminates at the elevated region 38.

The top view of FIG. 7B shows the layout of the resistor R2 and the diode D21 in relation to the FET T2 and the diode D22. For example, as shown in FIG. 7B, the resistor R2 and the diode D21 are connected in series, of which this connection is parallel to the LED D2, FET T2 and diode D22. In addition, FIG. 7B shows the gate G of the FET T2 coupled to a node formed between the resistor R2 and the diode D21.

FIGS. 7A-7B further show that the anode and the cathode of the SSLS LED2 can have an electrode 42 formed there over. In particular, the electrode 42 can be formed over the p-type semiconductor layer 28 and the elevated region 38 of the n-type semiconductor layer 26.

FIGS. 7A-7B also show that the monolithically integrated SSLS and electronic control circuit 24 can be formed on a substrate/buffer 44. The substrate/buffer 44 is illustrated in FIGS. 7A-7B as one element, however, it is understood that the substrate and buffer can comprise separate elements. In one embodiment, the monolithically integrated SSLS and electronic control circuit 24 can be formed on the buffer layer, which can be formed on the substrate. In one embodiment, the substrate can include sapphire, silicon carbide (SiC), silicon (Si), GaN, AlGaN, AlON, LiGaO$_2$, or another suitable material, and the buffer layer can include AlN, an AlGaN/AlN superlattice, and/or the like. In one embodiment, the substrate can include a non-conductive or insulating substrate. Examples of non-conductive or insulating substrate can include highly-resistive silicon, insulating SiC, sapphire, diamond, a dielectric material, organic materials, and/or the like.

The monolithically integrated SSLS and electronic control circuit 24 can form a group III-V materials based-device, in which some or all of the various layers are formed of elements selected from the group III-V materials system. In a more particular illustrative embodiment, the various layers of the monolithically integrated SSLS and electronic control circuit 24 can be formed of group III nitride based materials. Group III nitride materials comprise one or more group III elements (e.g., boron (B), aluminum (Al), gallium (Ga), and indium (In)) and nitrogen (N), such that $B_wAl_xGa_yIn_zN$, where $0 \leq W, X, Y, Z \leq 1$, and $W+X+Y+Z=1$. Illustrative group III nitride materials can include binary, ternary and quaternary alloys such as, AlN, GaN, InN, GaAs, GaInP, BN, AlGaN, AlInGaN, AlInN, AlBN, AlGaInN, AlGaBN, AlInBN, and AlGaInBN with any molar fraction of group III elements.

An illustrative embodiment of a group III nitride based light generating structure 30 that includes a multi-quantum well (e.g., a series of alternating quantum wells and barriers) can comprise $In_yAl_xGa_{1-x-y}N$, $Ga_zIn_yAl_xB_{1-x-y-z}N$, an $Al_xGa_{1-x}N$ semiconductor alloy, or the like. Similarly, both the n-type semiconductor layer 26 and the p-type semiconductor layer 28 and can be composed of an $In_yAl_xGa_{1-x-y}N$ alloy, $Ga_zIn_yAl_xB_{1-x-y-z}N$ alloy, or the like. The molar fractions given by x, y, and z can vary between the various layers 26, 28, and 30.

The monolithically integrated SSLS and electronic control circuit 24 can also include dielectric materials and metals. Examples of dielectric material can include, but are not limited to, $SiO_2$, $Si_3N_4$, $Al_2O_3$, and/or the like, while examples of metals can include, but are not limited to, Al, Ni, Au, Mo, etc.

The monolithically integrated SSLS and electronic control circuit 24 can form a group II-VI materials based-device, in which some or all of the various layers are formed of elements selected from the group II-VI materials system. In a more particular illustrative embodiment, the various layers of the monolithically integrated SSLS and electronic control circuit 24 can be formed of ZnO, MgO, CdO, etc, ternary compounds of these materials, such as ZnMgO, and/or the like.

It is understood that the FET used in any of the various embodiments described herein can include any type of FET with a normally-on channel that is in a conducting state when no external voltage is applied to it. For illustrative purposes the FET design can be for a MESFET type device, however, it is understood that the design or variations thereof are suitable for other FET devices such as MOSFET types, JFET types, heterojunction FET types, or HEMT types. The diodes D21 and D22, as well any of the other diodes used in the various branches of the SSLS control circuit can include Schottky diodes, junction diodes or any other type of semiconductor diodes.

Figure 8:
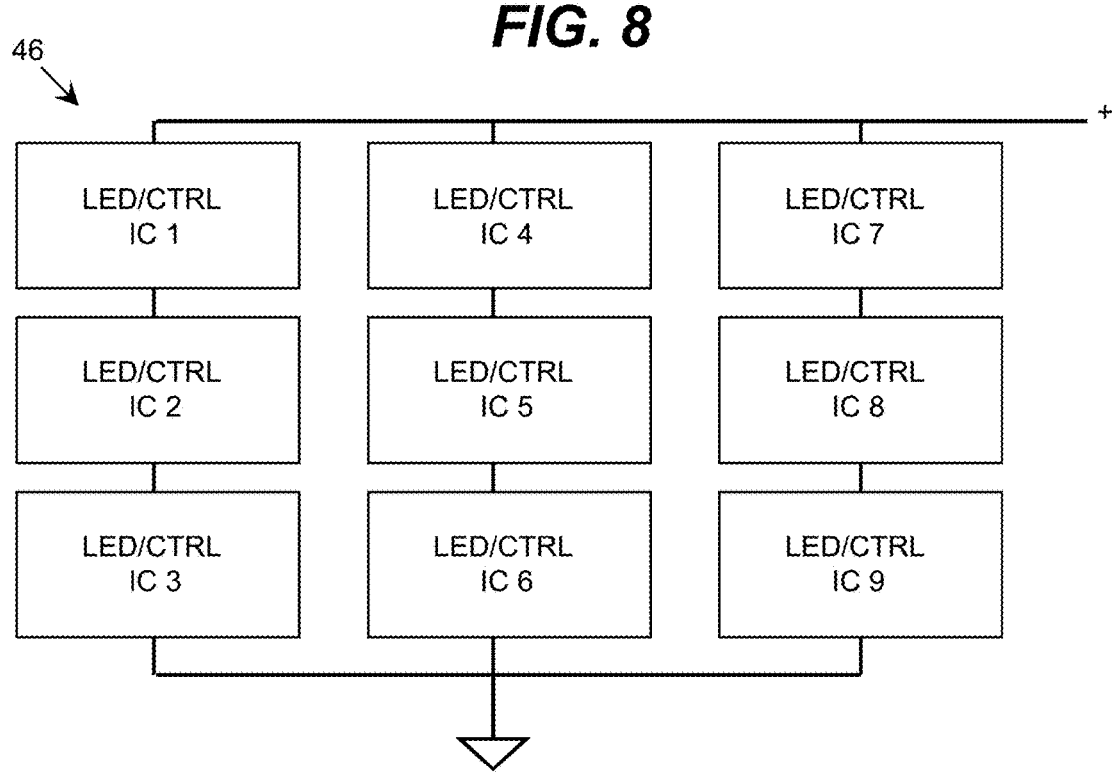
FIG. 8 shows a schematic diagram of a plurality of SSLS control circuits each integrated with an individual SSLS to form a series or a parallel SSLS structured-array according to an embodiment.

FIG. 8 shows a schematic diagram of a SSLS structure and SSLS control circuit 46 according to an alternative embodiment. In this embodiment, the SSLS structure and SSLS control circuit 46 include a plurality of SSLS control circuits each integrated with an individual SSLS to form a series and/or a parallel SSLS structured-array. In this configuration, each integrated SSLS control circuit can be configured to limit current within its corresponding SSLS. This approach can result in an increase in the total optical power of the SSLS structure which in one embodiment can include a lamp.

In the embodiment depicted in FIG. 8, each SSLS (e.g., LED) and integrated SSLC control circuit can take the form of the configuration illustrated in FIG. 5. In one embodiment, each SSLS and integrated SSLC control circuit can be arranged in an array such that columns are connected in series. For example, as shown in FIG. 8, LED/CTRL IC 1 is connected in series with LED/CTRL IC 2, and LED/CTRL IC 3, while LED/CTRL IC 4 is connected in series with LED/CTRL IC 5, and LED/CTRL IC 6, and LED/CTRL IC 7 is connected in series with LED/CTRL IC 8, and LED/CTRL IC 9. This arrangement of the SSLSs and their respective integrated SSLC control circuits can be connected to a positive terminal of a voltage supply.

The configuration of FIG. 8 can operate as follows. All LED/CTRL combinations connected in series can have the same saturation current and turn-on voltage. The turn-on sequentially increases between subsequent groups, i.e., the turn-on voltage for the group LED/CTRL IC (4-6) is higher than that of the group LED/CTRL IC (1-3) and lower than that of the group LED/CTRL IC (7-8). In such an arrangement, the groups of LED/CTRL ICs operate similarly to individual branches LED1, LED2, LED3 shown in FIG. 3. For example, as the bias voltage increases from zero, first only the branch containing LED/CTRL IC (1-3) would turn on. As the bias voltage further increases, the current through this branch saturates, and the subsequent group LED/CTRL IC (4-6) turns on, etc. This arrangement allows for simultaneous control of more light sources while also allowing a geometric distribution of the light sources to provide uniform large area illumination. For example, group LED/CTRL IC (1-3) might form a smaller circle within a lamp, the next group forms a larger circle etc. It is understood that other layouts (e.g. squares, strips etc.) are also applicable.

Figure 9:
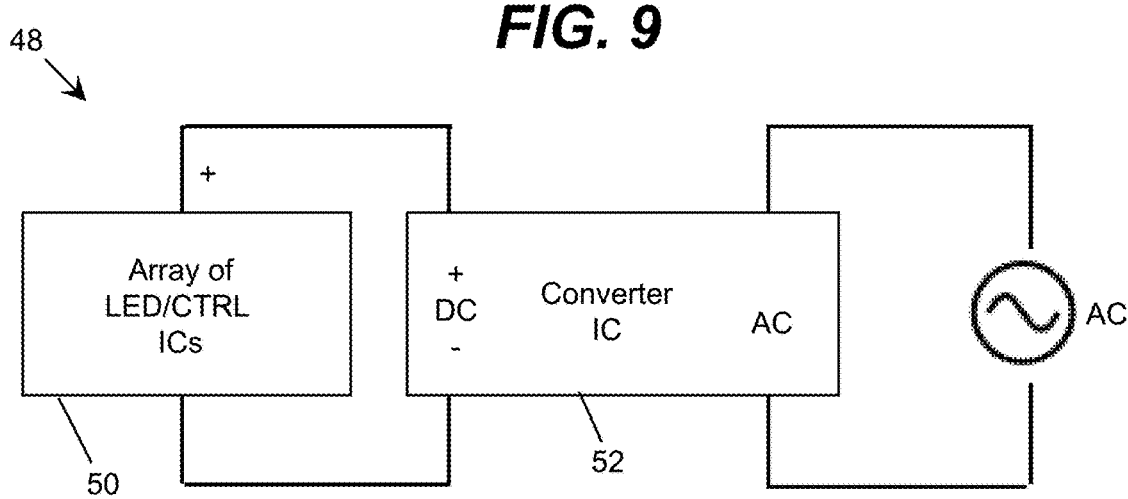
FIG. 9 shows a schematic diagram of a SSLS structured array with integrated SSLS control circuits connected to an AC voltage supply through a DC voltage to an AC voltage converter according to an embodiment.

FIG. 9 shows a schematic diagram of a SSLS structure and SSLS control circuit 48 according to yet another alternative embodiment. In this embodiment, a SSLS structured-array with integrated SSLS control circuits 50 can be connected to an AC voltage supply through a DC voltage to an AC voltage converter 52 according to an embodiment. In one embodiment, the SSLS structured-array with integrated SSLS control circuits 50 can take the form of the array depicted in FIG. 8, however, it is understood that other SSLS arrays are within the scope of this embodiment. As shown in FIG. 9, the SSLS structured-array with integrated SSLS control circuits 50 can be coupled to the DC side of the DC voltage to an AC voltage converter 52, while the AC voltage source can be coupled to the AC side of the DC voltage to an AC voltage converter 52. Although FIG. 9, shows an AC voltage coupled to the AC side of the DC voltage to an AC voltage converter 52, it is understood that other types of sources can be connected such as an AC current source.

The configuration of FIG. 9 can operate as follows. For example, the AC voltage applied to the converter IC 52 can be converted to an equivalent DC voltage which is further applied to the array of LED/CTRL ICs 50. The array 50 then operates similarly to that of FIG. 3 or 8. This arrangement allows the invented circuit to be utilized in conjunction with commercially available AC voltage sources and residential AC outlets.

Figure 10:
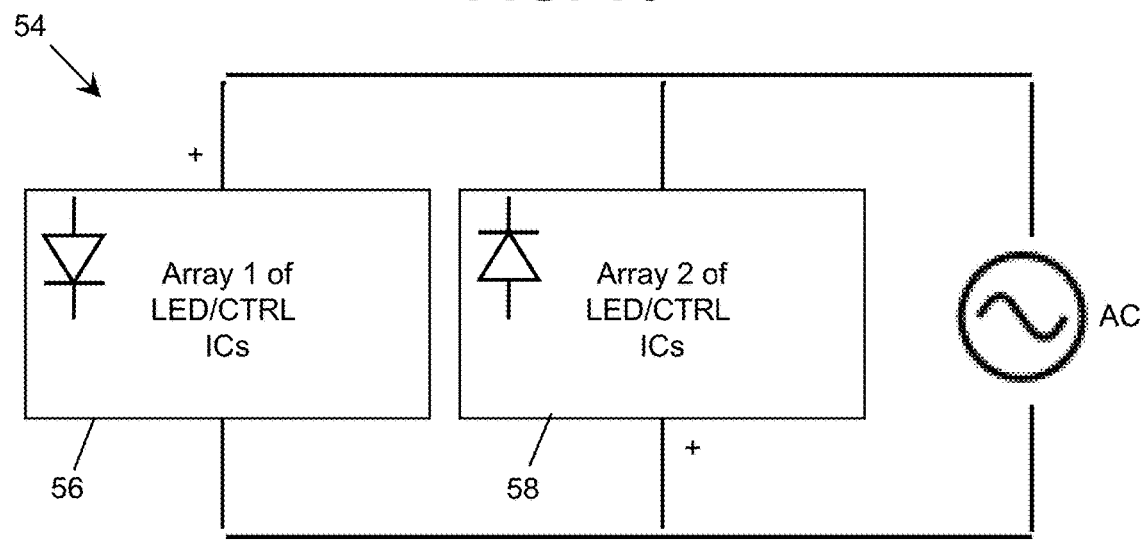
FIG. 10 shows a schematic diagram of a SSLS structured-array with integrated SSLS control circuits arranged to form a first group and a second group having an anti-parallel or flipped connection that permits a connection to an AC voltage supply without the use of an electronic converter according to an embodiment.

FIG. 10 shows a schematic diagram of a SSLS structure and SSLS control circuit 54 according to a further alternative embodiment. In particular, FIG. 10 shows a schematic diagram of the SSLS structured-array with integrated SSLS control circuit 54 arranged to form a first group 56 and a second group 58. Both the first group 56 and the second group 58 can include arrays of SSLSs and corresponding integrated SSLS control circuits such as those depicted in FIG. 8, however, as noted above, other arrangements of these components are possible. In one embodiment, the first group 56 can include integrated SSLS control circuits with its corresponding SSLSs having an anode connected to a positive terminal of an AC voltage supply, and the second group can include integrated SSLS control circuits with its corresponding SSLSs having an anode connected to a negative terminal of the AC voltage supply. In this manner, there is an anti-parallel or flipped connection between the groups 56 and 58 that permits a connection to the AC voltage supply without the use of an electronic converter like the implementation depicted in FIG. 9. For example, the first group 56 could turn on when the AC source polarity is positive, while the second group 58 would be kept turned off. Similarly, when the AC source polarity is negative, the second group 58 could turn on, while the first group 56 would be turned off.

This operation is the opposite of the circuit diagram of FIG. 3, in which all of the LEDs and diodes have the same polarity. As a result, when the top bus connecting the LEDs in FIG. 3 is positively biased, all of the LEDs and all of the diodes in the circuit will be forward-biased. If the top bus in FIG. 3 is negatively biased, then all of the LEDs and all of the diodes in the circuit will be reverse-biased. Therefore, the anti-parallel connection of two or more arrays of the LED/Control ICs (i.e., the first group 56 and the second group 58) depicted in FIG. 10 would turn on the array of the first group 56 when the AC source polarity is positive keeping the array second group 58 off. Similarly, this arrangement would turn on the array of the second group 58 when the AC source polarity is negative keeping the array of the first group 56 off.

The SSLS structure with integrated SSLS control of the various embodiments described herein can be configured to operate in one of a variety of ways depending on the intended application of the SSLS structure. For example, the SSLS structure of the various embodiments can be positioned and turned on in a sequence designed to deliver a specific angular and spatial distribution of intensity such that at least several wavelengths are used. In another embodiment, the SSLS structure and integrated SSLS control can be used to turn on and turn off individual SSLSs in a manner that achieves a temporal and spatial target distribution of wavelengths.

In other embodiments, the SSLS structure with integrated SSLS control can operate as a function of temperature. For example, in one embodiment, some of the SSLSs in the SSLS structure can include a temperature-based current controlling element, wherein the current to a SSLS can be determined based on the junction temperature of the SSLS. In one embodiment, the current to all of the SSLS devices in the SSLS structure can be determined based on the total temperature of the structure. In another embodiment, the current to all of the SSLS devices in the SSLS structure can be based on minimizing the temperature variance throughout the structure.

In additional embodiments, the SSLS structure with integrated SSLS control can be configured to have optical components. For example, the part of the SSLS structure can have movable optics components, including, but not limited to, lens, collimators, filters, etc. In one embodiment, the position of the optics components within a SSLS structure can be configured to be dependent on a number and location of operational SSLS units that function with the structure to provide a certain amount of output power into a particular area.

In one embodiment, a SSLS structure with integrated SSLS control can include at least one redundant SSLS with integrated SSLS control. For example, a lamp can be configured to include a multi-element array of SSLSs with integrated SSLS control and at least one additional array of SSLSs with integrated control. In order to attain an extended lifetime and intensity preserving output, the lamp can be configured to further include at least one light sensor within the SSLSs. In one embodiment, each light sensor can be used to measure the power output generated from its corresponding SSLS. In this manner, the measure of power output serves a purpose of recognizing SSLS degradation. Furthermore, the SSLS control can be configured to adjust the output of either an already operational SSLS, or to turn on one or a set of redundant SSLSs to maintain the required intensity output at a required current and voltage specification.

In another embodiment, an electrical means, such as, for example, a diode, a resistor or transistor, an integrated circuit, and/or the like, can be configured with the lamp, to attest the output power generated from the individual SSLSs. For example, an integrated circuit can determine the reversed leakage current, which can be used to infer the degree of degradation of the SSLS structure or device in which it operates. In another example, an integrated circuit can determine the switch on-off time of the SSLS structure, which can also be used to infer the degree of degradation of the SSLS structure or device in which it operates. In another embodiment, the SSLS structure can be incorporated into a package that contains a reflector having a light sensor integrated therein.

In other embodiments, the SSLS structure with integrated SSLS control can be configured to operate in conjunction with an ozone meter to measure ozone levels proximate the structure. In this manner, the SSLS control would turn on individual SSLSs or groups of SSLSs as a function of the saturation current of the SSLSs to operate with the aforementioned turn on voltage offsets. The ozone meter could then operate according to its intended function by generating warnings if the ozone levels are determined to be above predetermined ozone level limits. In one embodiment, the SSLS control can be configured to automatically adjust the current levels within the SSLS structure to match a maximum ozone level limit.

Figure 11:
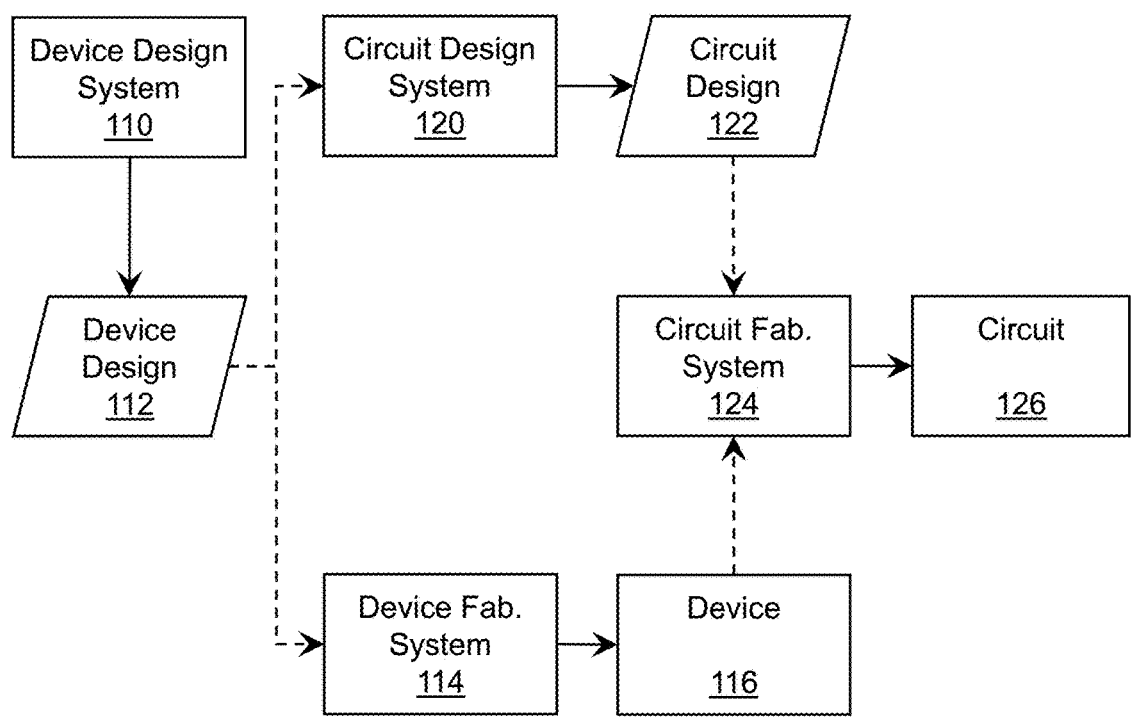
FIG. 11 shows an illustrative flow diagram for fabricating a circuit that comprises a SSLS structure with a SSLS control circuit according to one the various embodiments described herein.

In one embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein. In either case, the corresponding fabrication system 114, 124, can include a robotic arm and/or electromagnet, which can be utilized as part of the fabrication process as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device, comprising:
   a solid-state light source (SSLS) structure including an array of SSLSs; and
   a SSLS control circuit integrated with the SSLS structure to control a total operating current of the SSLS structure within a predetermined total operating current limit, wherein the SSLS control circuit is configured to selectively limit current in individual SSLSs and in groups of SSLSs to maintain the total operating current of the SSLS structure within the predetermined total operating current limit, the SSLS control circuit maintaining the total operating current of the SSLS structure within the predetermined total operating current limit as a function of a saturation current associated with the SSLSs.

2. The device according to claim 1, wherein the SSLS control circuit is configured to turn on individual SSLSs and groups of SSLS in a sequential order until all SSLSs in the SSLS structure are turned on while maintaining the total operating current within the predetermined total operating current limit.

3. The device according to claim 2, wherein the SSLS control circuit is configured to use a saturation current of a first individual SSLS or a first group of SSLSs that is turned on as a basis to turn-on a subsequent individual SSLS or group of SSLSs in the sequential order, wherein the SSLS control circuit turns on the subsequent individual SSLSs or group of SSLSs in the sequential order in response to the first individual SSLS or the first group of SSLSs attaining the saturation current.

4. The device according to claim 3, wherein the SSLS control circuit turns on each subsequent individual SSLS or group of SSLSs in the sequential order as function of a preceding individual SSLS or group of SSLSs in the sequential order reaching its saturation current.

5. The device according to claim 1, wherein the SSLS control circuit comprises a plurality of field-effect transistors, each field-effect transistor connected in series to one of the SSLSs in the SSLS structure.

6. The device according to claim 5, wherein the SSLS control circuit further comprises a plurality of diodes, wherein most of the field-effect transistors comprise at least one diode connected to a gate and a source of the field-effect transistor.

7. The device according to claim 6, wherein the diodes associated with each transistor are in parallel with the diodes associated with the other transistors.

8. The device according to claim 6, wherein each diode connected to the gate and source of the field-effect transistors comprises a turn on voltage that is adjusted to correlate with the saturation current of its corresponding SSLS, wherein the turn on voltages of each diode associated with a field-effect transistor is offset a predetermined amount from the turn on voltages of each diode associated with an immediately adjacent field-effect transistor.

9. The device according to claim 5, further comprising a control voltage supply connecting to a gate of each of the field-effect transistors.

10. The device according to claim 1, further comprising a voltage supply connected to the SSLS structure and the SSLS control circuit.

11. The device according to claim 1, further comprising a current supply connected to the SSLS structure and the SSLS control circuit.

12. The device according to claim 1, wherein the SSLS control circuit comprises a plurality of integrated SSLS control circuits, wherein each integrated SSLS control circuit is integrated with one of the SSLSs in the array of the SSLS structure, each integrated SSLS control circuit is configured to limit current within its corresponding SSLS.

13. The device according to claim 12, further comprising an AC voltage supply and a DC voltage to an AC voltage converter that couples the plurality of integrated SSLS control circuits and the SSLS structure to the AC voltage supply.

14. The device according to claim 12, wherein the plurality of integrated SSLS control circuits and SSLS structure form a first group and a second group, wherein the first group comprises integrated SSLS control circuits with its corresponding SSLSs having an anode connected to a positive terminal of an AC voltage supply, and the second group comprises integrated SSLS control circuits with its corresponding SSLSs having an anode connected to a negative terminal of the AC voltage supply.

15. A device, comprising:
   a solid-state light source (SSLS) structure including a plurality of SSLSs; and
   a SSLS control circuit integrated with the SSLS structure to control a total operating current of the SSLS structure within a predetermined total operating current limit specified for attaining a desired amount of optical power, wherein the SSLS control circuit comprises a plurality of field-effect transistors, each field-effect transistor connected in series to one of the SSLSs in the SSLS structure, and a plurality of field-effect transistor activation components configured to activate the plurality of field-effect transistors, wherein most of the field-effect transistors comprise a corresponding field-effect transistor activation component, wherein the SSLS control circuit is configured to turn on individual SSLSs and groups of SSLS in a sequential order as a function of a saturation current associated with the SSLSs.

16. The device according to claim 15, wherein the SSLS control circuit is configured to use a saturation current of a first individual SSLS or a first group of SSLSs that is turned on as a basis to turn on a subsequent individual SSLSs or group of SSLSs in the sequential order, wherein the SSLS control circuit turns on the subsequent individual SSLS or group of SSLSs in the sequential order in response to the first individual SSLS or the first group of SSLSs attaining the saturation current.

17. The device according to claim 16, wherein the subsequent individual SSLS or group of SSLSs has a turn on voltage corresponding to a voltage causing the first individual SSLS or the first group of SSLSs to saturate current.

18. The system of claim 17, wherein each field-effect transistor activation component comprises at least one diode connected to a gate and source of its corresponding field-effect transistor, the at least one diode having a turn on voltage that activates the field-effect transistor, the turn on voltage of the diode corresponding to the voltage causing the immediately preceding SSLS in the sequential order of the SSLS structure to saturate current.

19. The device according to claim 16, wherein the SSLS control circuit turns on each subsequent individual SSLS or group of SSLSs in the sequential order as function of a preceding individual SSLS or group of SSLSs in the sequential order reaching its saturation current, each subsequent individual SSLS or group of SSLS having a turn on voltage corresponding to a voltage causing the preceding SSLS or the preceding group of SSLSs to saturate current.

20. A device, comprising:
a solid-state light source (SSLS) structure including a plurality of SSLSs;
a SSLS control circuit to maintain a total operating current of the SSLS structure within a predetermined total operating current limit, wherein the SSLS control circuit comprises a plurality of SSLS control circuits, each SSLS control circuit integrated with one of the SSLSs in the array of the SSLS structure to limit current within its corresponding SSLS as a function of a saturation current associated with the SSLSs, all of the SSLS control circuits and corresponding SSLSs forming an array of SSLSs and SSLS control circuits; and
one of a current source and a voltage source coupled to the array of SSLSs and SSLS control circuits.

* * * * *